United States Patent [19]

Tanaka

[11] Patent Number: 4,649,830
[45] Date of Patent: Mar. 17, 1987

[54] CLEAN TUNNEL CONVEYING STRUCTURE

[75] Inventor: Hirokuni Tanaka, Ooiso, Japan

[73] Assignee: Sanki Kogyo Kabushiki Kaisha, Tokyo, Japan

[21] Appl. No.: 771,225

[22] Filed: Aug. 30, 1985

[30] Foreign Application Priority Data

Sep. 3, 1984 [JP] Japan ................................ 59-182734

[51] Int. Cl.[4] ...................... B61B 13/10; B61F 13/00; B65G 49/05
[52] U.S. Cl. ................................ 104/138.1; 104/140; 414/217; 15/306 B
[58] Field of Search ..................... 104/138 R, 139, 140; 414/217; 15/306 R, 306 A, 306 B, 316 R; 34/216; 134/61, 94, 140; 98/115.2; 118/324, 326, 630

[56] References Cited

U.S. PATENT DOCUMENTS

| 886,627 | 5/1908 | Neebe | 104/139 X |
| 4,133,255 | 1/1979 | Guice | 98/115.2 |
| 4,338,958 | 7/1982 | Fujita | 98/115.2 X |
| 4,540,326 | 9/1985 | Southworth et al. | 104/138 R X |

Primary Examiner—Robert B. Reeves
Assistant Examiner—Scott H. Werny
Attorney, Agent, or Firm—Louis E. Marn

[57] ABSTRACT

Articles are transferred in a coverless casing while avoiding contamination. The casing is disposed in a first tunnel zone and attached to, but isolated with separator, from a driving assembly located in a second tunnel zone. Air openings exist between the separators through which a column connects the casing to the driving assembly. Blowers force air through a filter into the first tunnel zone, where it flows through the air openings into the second tunnel zone, then is withdrawn through an air outlet. This air flow keeps the first tunnel zone clean by not permitting contaminants from the second tunnel zone to enter the first tunnel zone.

3 Claims, 6 Drawing Figures

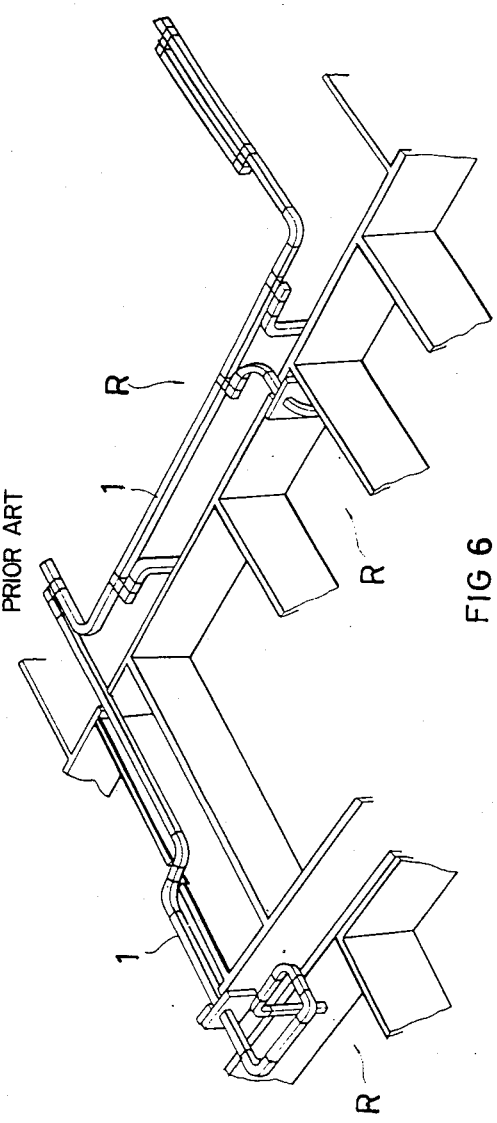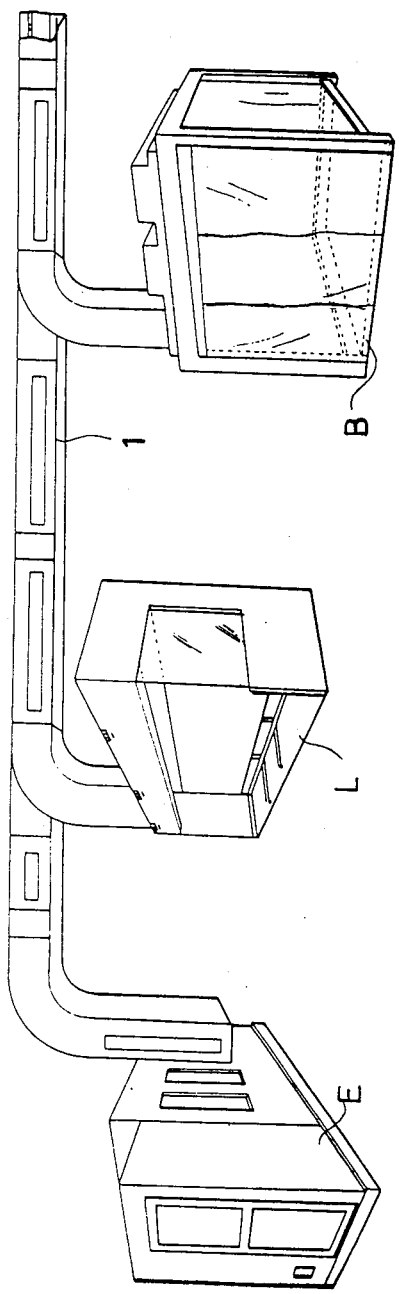

CLEAN TUNNEL CONVEYING STRUCTURE

BACKGROUND OF THE INVENTION

1. Field of the Invention

This invention relates to a clean tunnel structure, in which materials and articles to be conveyed in a clean tunnel are kept constantly in a clean condition.

2. Description of the Prior Art

To convey semiconductors or the like in a clean room or tunnel, a light-weight self-running truck having a casing with a cover plate is employed. The semiconductors must always be kept in a clean condition. FIG. 5 shows a conventional clean tunnel 1 which is used for connecting a plurality of neighboring clean rooms R. FIG. 6 shows another conventional clean tunnel 1 which is connected to an environmental chamber E, a line-type clean bench L and a clean booth B. The clean tunnel 1 communicates with some places other than the clean rooms, so that clean air must be filled therein. Disposed in the clean tunnel is a conveying means as shown in FIGS. 3 and 4. The conveying means is a self-running truck.

The clean tunnel 1 is provided with a frame body 2 of a rectangular section having an air flow passage $2k$ at its upper part and an air filter 3 under the air flow passage $2k$. Any type of air filter having a high efficiency may be selected. On the other hand, two travelling rails 4 are laid in a longitudinal direction on a center of a bottom plate $2b$ of the frame body 2. Further, disposed between the two rails 4 are a conventional signal supply cable and a conventional power supply cable, both of which are not illustrated.

A plurality of air inlets 5 spaced from each other are disposed along a side wall $2s$ of the air flow passage $2k$ and a plurality of air outlets 6 spaced from each other are disposed on the bottom plate $2b$ so as to correspond to the plurality of air inlets 5. Numeral 7 is a transparent plastic plate mounted between both ends of the side wall $2s$. A user can see the travelling condition of a self-running truck 8 and other things.

The self-running truck 8 (hereinafter called briefly "truck") for conveying e.g. the semiconductor wafers is driven automatically on the rails 4 by power supply of the power supply cable. It comprises driving means $8r$ for driving wheels $8w$, mechanical means $8k$ having braking means, starting means or the like, a casing $8c$ for conveying articles, and a cover plate $8f$ for covering the casing $8c$.

Air supplied into the passage $2k$ by way of the air inlet 5 from an air blower (not illustrated) is filtered by the air filter 3, and a clean air flows as a laminar layer downwardly with an air flow speed of 0.5 m/s. Thus the interior $2t$ of the tunnel 1 is fully filled with the clean air. It is discharged outside through the air outlet 6 by driving an air discharge blower (not illustrated).

The materials, parts and articles to be conveyed are delivered to respective automatic processing stations where robot devices are disposed, and must be subject to automatic processing. At the processing stations, these materials, parts, and articles must be exposed outwardly with no covering. Otherwise, a suitable processing cannot be carried out effectively.

Further, according to a conventional clean tunnel, as the speed of the truck 8 is increased, air vortex flow occurs behind the truck 8, thereby to form dust as a result of contact between the wheels of the truck 8 and the rails 4. Because of this, the air purification degree within the tunnel is decreased and those materials, parts and articles are polluted. Thus, the running speed of the truck 8 must be restricted, so that its conveying efficiency is reduced.

BRIEF SUMMARY OF THE INVENTION

Accordingly, it is a general object of this invention to provide a clean tunnel structure, in which any materials, parts and articles incorporated in a coverless casing of a self-running truck for travelling in the clean tunnel are constantly maintained in a clean condition and protected from penetration of any dusts.

More specifically, the clean tunnel structure comprises a self-running truck having a coverless casing mounted on a column fixed with means for driving said self-running truck, a first tunnel zone for conveying the materials, parts and articles incorporated in the coverless casing and a second tunnel zone where the driving means is disposed. The first tunnel zone and the second tunnel zone are partitioned from each other by a plurality of separators having a center air opening and a pair of side air openings. The column for fixing the driving means with the coverless container passes through the center air opening.

Other and further objects, features and advantages of this invention will appear more fully from the following description taken in connection with the accompanying drawings.

BRIEF DESCRIPTION OF THE ACCOMPANYING DRAWINGS

FIGS. 5 and 6 are perspective views relating to the layout of a conventional clean tunnel.

DETAILED DESCRIPTION OF THE INVENTION

A preferred example of this invention will be described with reference to FIGS. 1 and 2.

Figure 3:
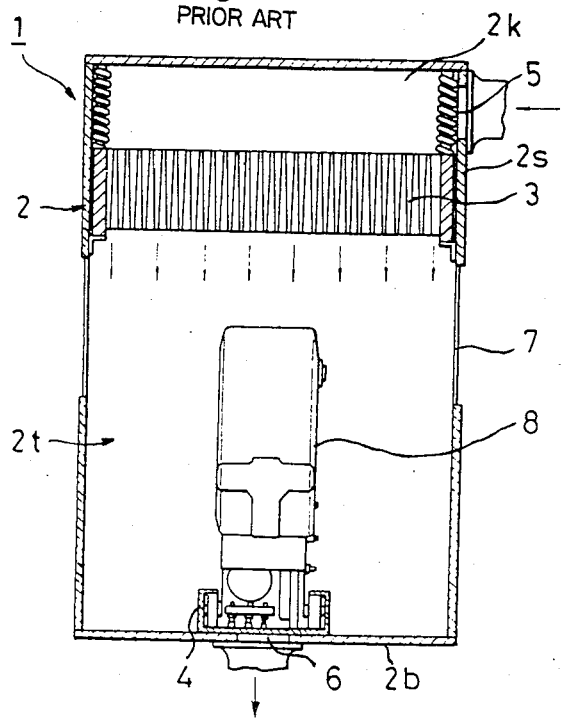
FIG. 3 is a section view of a conventional clean tunnel structure.
Figure 4:
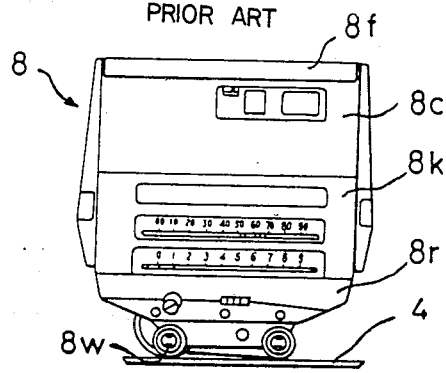
FIG. 4 is a side view of a conventional self-running truck for travelling a clean tunnel.

Since the same construction as shown in the prior art of FIGS. 3 and 4 has the same numerals, its description will be omitted.

Figure 1:
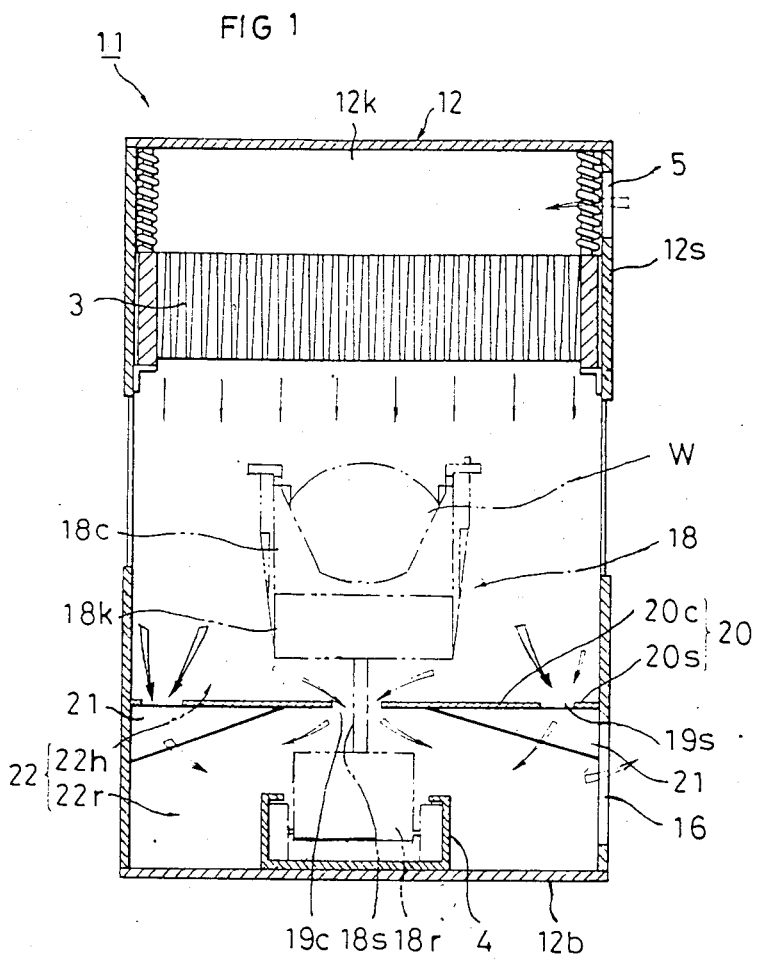
FIG. 1 is a section view of an example of a clean tunnel structure according to this invention.
Figure 2:
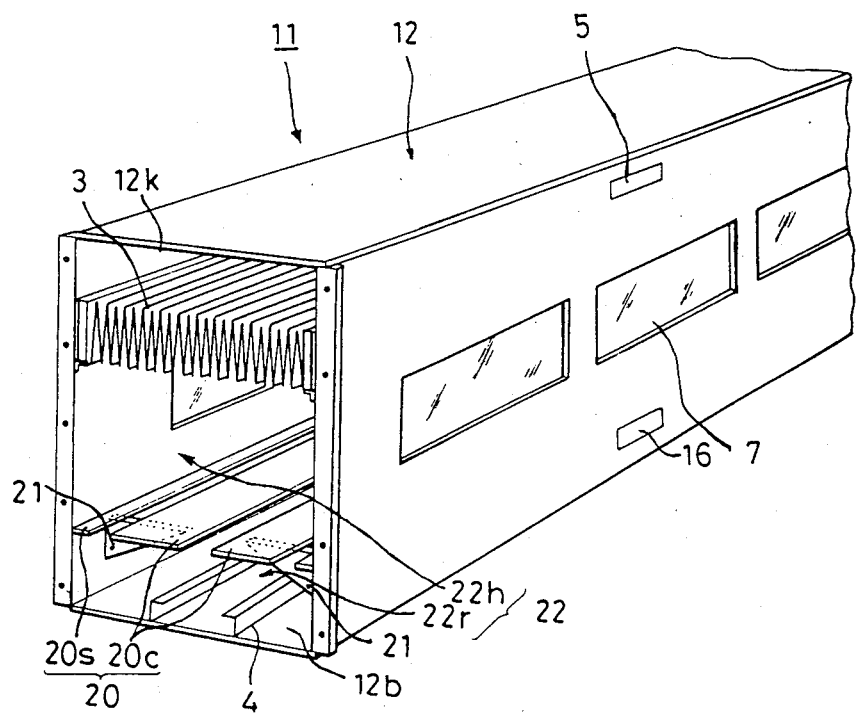
FIG. 2 is a partially cutaway perspective view of the example in FIG. 1.

In FIG. 1, there is shown a clean tunnel 11, in which a self-running truck 18 for conveying materials, parts and articles is disposed. It is of course optional to join a plurality of self-running trucks 18 to each other. The clean tunnel 11 is provided with a frame body 12 having an air flow passage $12k$ and the air filter 3 under the air flow passage $12k$. Laid on a bottom plate $12b$ of the frame body 12 is a travelling rail means 4. Disposed in the travelling rail means 4 are a conventional signal supply cable and a conventional power supply cable, both of which are not illustrated.

The plurality of air inlets 5 spaced with each other are also disposed along a side wall $12s$ of the air flow passage $12k$. Numeral 16 is an air outlet for discharging air from a tunnel zone $22r$, in which means $18r$ for driving the truck 18 is disposed. A plurality of air outlets 16 spaced with each other are disposed so as to correspond to the plurality of air inlets 5.

A tunnel zone 22 consists of a first tunnel zone 22h for conveying the materials, parts, and articles by the truck 18 and a second tunnel zone, in which the means 18r for driving the truck 18 is disposed. The first tunnel zone 22h and the second tunnel zone 22r are partitioned by a plurality of separators 20 having a pair of center separators 20c and a pair of side separator 20s. The pair of center separators 20c is provided with a center air opening 19c, while a pair of side air openings 19s are formed between the pair of center separators 20c and the pair of side separators 20s.

The travelling truck 18 and the driving means 18r are fixed to each other by a column 18s which passes through the center air opening 19c. More specifically, a top end of the column 18s is fixed to a mechanical part 18k of the truck 18, while a bottom end thereof is fixed to a center of the driving means 18r. Numeral 18c is a coverless casing of the truck 18.

A function of the clean tunnel of this invention will be described.

Materials and articles W such as semiconductor wafers or the like are incorporated in the coverless casing 18c and coveyed by the travelling truck 18 within the clean tunnel. The materials and articles W are directed to respective stations (not illustrated) having automatic processing means.

The air supplied into the air flow passage 12k through the air inlets 5 by an air blower (not illustrated) filtered by the air filter 3 and filtered clean air is blown as a laminar layer downwardly into the first tunnel zone 22h with an air flow speed of about 0.5 m per second. The air pressure within the first tunnel zone 22h is increased because the air flow is prevented by the plurality of separators 20, but the clean air blown from the upper side passes through the center air openings 19c as well as the side air openings 19s, enters the second tunnel zone 22r with the air flow speed of about 4 m per second and finally is discharged from the outlets 16 into the outside.

Thus, the air pressure in the second tunnel zone 22r is always lower than that in the first tunnel zone. In addition, since the clean air is blown constantly into the second tunnel zone 22r through the air openings 19c and 19s of the plurality of separators 20, air penetration of the second tunnel zone 22r into the first tunnel zone 22h is entirely prevented. Accordingly, any dust that may occur in the second tunnel zone 22r where the driving means 18r and the rail means 4 are disposed is completely prevented from penetrating into the first tunnel zone 22h where the articles W to be conveyed are incorporated in the coverless casing 18c.

In addition, since the filtered clean air is blowing directly on the articles W incorporated in the coverless casing 18c, they are always kept in a clean condition even if any dusts will occur in connection with travelling of the truck 18. Such dusts, if any, may be finally discharged from the air outlets 16 through the air openings 19c and 19s.

As a result, it is not required to limit the speed of the truck. Thus, the truck may run with a speed of e.g. 60 cm per second, and the articles may be delivered to an automatic processing and fabricating means.

According to one aspect of this invention, a downward flow of the clean air filtered by the air filter is restricted by the plurality of separators, so that the air pressure within the first tunnel zone is increased more than that within the second tunnel zone. As a result, even if air vortex flow takes places behind means for driving the truck as well as the rail means in connection with travelling of the truck, any dusts that may occur due to such air vortex flow are entirely prevented from penetrating into the first tunnel zone. Accordingly, the materials, parts, and articles in the casing positioned in the first tunnel zone are kept constantly in a completely clean condition, so that they may be exposed with no covering. Consequently, the speed of the truck may be selected optionally without considering occurrence of such air vortex flow. Further, application for automatic processing devices dependent on up-to-date robot engineering may be carried out effectively.

While I have shown and described a certain embodiment of my invention, it is to be understood that it is capable of many modifications. Changes, therefore, in the construction and arrangement may be made without departing from the spirit and scope of the invention as defined in the appended claims.

What is claimed is:

1. A clean tunnel conveying structure comprising:
   a self-running truck for travelling in said clean tunnel, said self-running truck having a coverless casing mounted on a column;
   means affixed to said column for driving said self-running truck;
   a first tunnel zone for conveying articles positioned in said coverless casing;
   a second tunnel zone for said driving means;
   a plurality of separators partitioning said first tunnel zone from said second tunnel-zone and comprised of a center air opening and side air openings, said column for said coverless casing passing through said center air opening;
   air inlet means for introducing air into said first tunnel zone;
   air outlet means for withdrawing air from said second tunnel zone; and
   blower means for moving air through said clean tunnel.

2. A clean tunnel conveying structure as claimed in claim 1 and further including an air filter for filtering air introduced into said first tunnel zone.

3. A clean tunnel conveying structure as claimed in claim 1, and further including rail means in said clean tunnel conveying structure for directing said self-running truck through said clean tunnel conveying structure.

* * * * *